(12) United States Patent
Yang et al.

(10) Patent No.: US 11,374,142 B2
(45) Date of Patent: Jun. 28, 2022

(54) ELECTRONIC DEVICE CAPABLE OF DETECTING IMAGES IN LOW-LIGHT ENVIRONMENT

(71) Applicant: InnoLux Corporation, Miao-Li County (TW)

(72) Inventors: Hui-Ching Yang, Miao-Li County (TW); Tao-Sheng Chang, Miao-Li County (TW); Te-Yu Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 56 days.

(21) Appl. No.: 16/794,251

(22) Filed: Feb. 19, 2020

(65) Prior Publication Data

US 2020/0313025 A1 Oct. 1, 2020

(30) Foreign Application Priority Data

Mar. 28, 2019 (CN) .......................... 201910245219.0

(51) Int. Cl.
| | |
|---|---|
| *H01L 27/14* | (2006.01) |
| *H01L 31/101* | (2006.01) |
| *H01L 31/113* | (2006.01) |
| H01L 21/8238 | (2006.01) |

(52) U.S. Cl.
CPC ........ *H01L 31/1013* (2013.01); *H01L 31/113* (2013.01); *H01L 21/823842* (2013.01)

(58) Field of Classification Search
CPC . H01L 31/02024–0203; H01L 31/1013; H01L 31/113; H01L 21/823842; H01L 27/14–14893

USPC .......................................................... 257/431
See application file for complete search history.

(56) References Cited

U.S. PATENT DOCUMENTS

| | | | | |
|---|---|---|---|---|
| 2003/0146993 | A1* | 8/2003 | Kokubun | H04N 5/363 348/308 |
| 2007/0075219 | A1* | 4/2007 | Hsieh | H04N 5/363 250/208.1 |
| 2009/0130600 | A1* | 5/2009 | Irving | H01L 29/7869 430/312 |
| 2015/0276474 | A1* | 10/2015 | Okada | H03K 17/78 250/214 A |
| 2018/0227516 | A1* | 8/2018 | Mo | H04N 5/378 |
| 2019/0025444 | A1* | 1/2019 | Charrat | H04N 5/32 |

* cited by examiner

*Primary Examiner* — Calvin Y Choi
(74) *Attorney, Agent, or Firm* — Winston Hsu

(57) ABSTRACT

An electronic device includes a photodiode, a first transistor, a second transistor, a third transistor and a capacitor. The photodiode has a first terminal and a second terminal. The first transistor has a control terminal used to receive a reset signal, a first terminal coupled to the second terminal of the photodiode, and a second terminal. The second transistor has a control terminal coupled to the second terminal of the photodiode, a first terminal and a second terminal. The third transistor has a control terminal used to receive a row selection signal, a first terminal coupled to the second terminal of the second transistor, and a second terminal. The capacitor has a first terminal coupled to the second terminal of the photodiode, and a second terminal coupled to the second terminal of the first transistor.

17 Claims, 4 Drawing Sheets

ELECTRONIC DEVICE CAPABLE OF DETECTING IMAGES IN LOW-LIGHT ENVIRONMENT

CROSS REFERENCE TO RELATED APPLICATION

This non-provisional application claims priority of China patent application No. 201910245219.0, filed on 28 Mar. 2019, included herein by reference in its entirety.

BACKGROUND OF THE DISCLOSURE

1. Field of the Disclosure

The disclosure relates to electronic devices, and specifically, to an electronic device having a photo-sensing component used to detect images.

2. Description of the Prior Art

Active pixel sensors are image sensors including photodiodes and active amplifiers, and are widely applicable to image sensing in devices such as digital cameras, digital scanners and fingerprint scanners. The active pixel sensors employ photodiodes to detect light intensity and convert the same into current having corresponding magnitudes. In the conventional approach, the area of the photodiodes may be increased to increase the current of the photodiodes in order to detect images when the light intensity is low. However, increasing the area of the photodiodes can also result in increased parasitic capacitance, leading to a reduction in the voltage generated by the photodiodes, and being inefficient for light detection and unable to provide clear images.

An active pixel sensor is in need to detect images in a low-light environment and enhance image quality.

SUMMARY OF THE DISCLOSURE

According to one embodiment of the invention, an electronic device includes a photodiode, a first transistor, a second transistor, a third transistor and a capacitor. The photodiode has a first terminal and a second terminal. The first transistor has a control terminal used to receive a reset signal, a first terminal coupled to the second terminal of the photodiode, and a second terminal. The second transistor has a control terminal coupled to the second terminal of the photodiode, a first terminal and a second terminal. The third transistor has a control terminal used to receive a row selection signal, a first terminal coupled to the second terminal of the second transistor, and a second terminal. The capacitor has a first terminal coupled to the second terminal of the photodiode, and a second terminal coupled to the second terminal of the first transistor.

These and other objectives of the present disclosure will no doubt become obvious to those of ordinary skill in the art after reading the following detailed description of the embodiment that is illustrated in the various figures and drawings.

DETAILED DESCRIPTION

Figure 1:
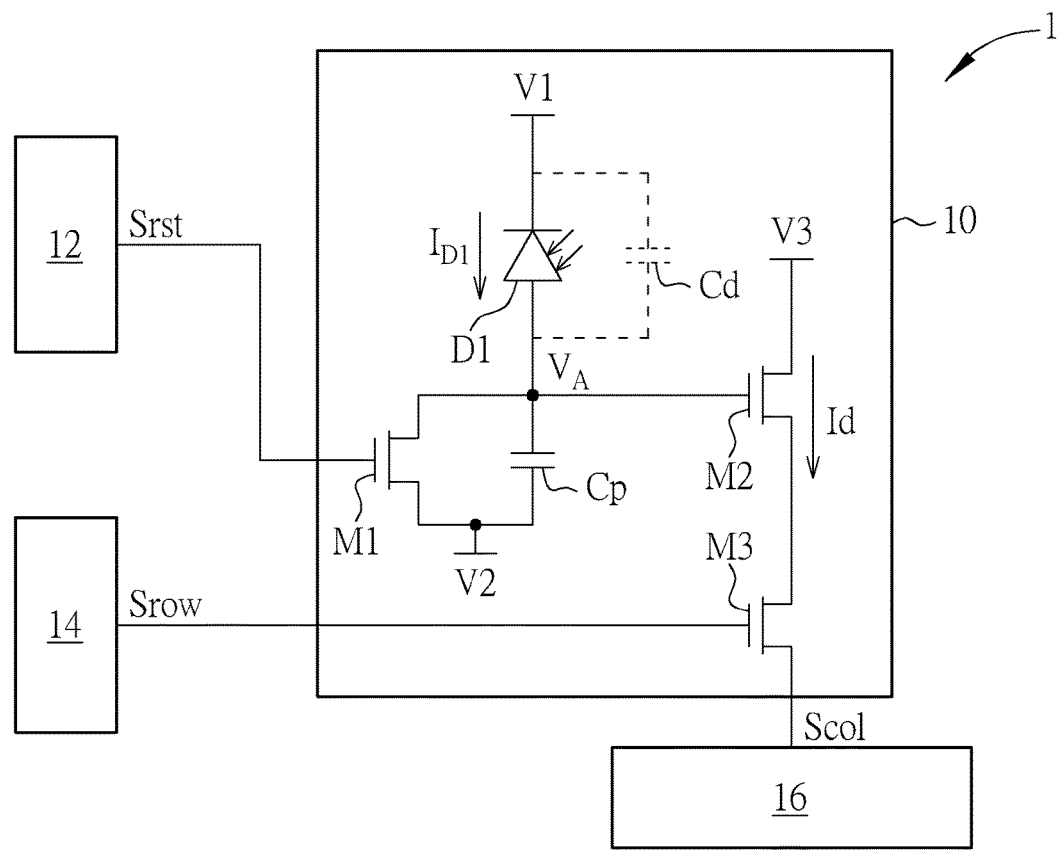
FIG. 1 is a schematic diagram of an electronic device according to an embodiment of the disclosure.

FIG. 1 is a schematic diagram of an electronic device 1 according to an embodiment of the disclosure. The electronic device is applicable to a complementary metal oxide semiconductor field-effect transistor (CMOS) image sensor or fingerprint detector, and may comprise an image sensing circuit 10, a reset driver 12, a scan driver 14 and a data driver 16. The reset driver 12, the scan driver 14 and the data driver 16 are respectively coupled to the image sensing circuit 10 to control the image sensing circuit 10 to operate in a reset mode, a sensing mode or a scan mode.

The image sensing circuit 10 may be an active pixel sensor, and may include a photodiode D1, a first transistor M1, a second transistor M2, a third transistor M3 and a capacitor Cp. The photodiode D1 has a first terminal configured to receive a first voltage V1, and a second terminal. The photodiode D1 has a parasitic capacitor Cd. The first transistor M1 has a control terminal coupled to the reset driver 12 to receive a reset signal Srst, a first terminal coupled to the second terminal of the photodiode D1, and a second terminal configured to receive a second voltage V2. The second transistor M2 has a control terminal coupled to second terminal of the photodiode D1, a first terminal configured to receive the third voltage V3, and a second terminal. The third transistor M3 has a control terminal coupled to the scan driver 14 to receive a row selection signal Srow, a first terminal coupled to the second terminal of the second transistor M2, and a second terminal coupled to the data driver 16 to output an output signal Scol. The capacitor Cp has a first terminal coupled to the second terminal of the photodiode D1 and the first terminal of the first transistor M1, and a second terminal configured to receive the second voltage V2. The first voltage V1 exceeds the second voltage V2. The third voltage V3 may be a variable voltage. The first transistor M1, the second transistor M2 and the third transistor M3 may all be N-type metal oxide semiconductor (NMOS) transistors. The first transistor M1, the second transistor M2 and the third transistor M3 may have a dual gate structure to reduce leakage currents, reducing interference of the leakage currents to a photocurrent $I_{D1}$ generated by the photodiode D1. The first transistor M1 may reset the capacitor Cp. The second transistor M2 may amplify the current $I_{D1}$ generated by the photodiode D1. The third transistor M3 may select an output signal Scol to be read.

In the reset mode, the image sensing circuit 10 may receive the row selection signal Srow to turn off the third transistor M3, and receive the reset signal Srst to turn on the first transistor M1 to reset a voltage $V_A$ to the second voltage V2, so as to reset the capacitor Cp, setting the photodiode D1 to a reverse biased state and to be ready for detecting light intensity of incident light. A voltage difference between the control terminal and the second terminal of the first transistor M1 ranges between 0.5V and 2V. A voltage difference between the first terminal and the second terminal of the photodiode D1 ranges between 0.5V and 1.5V. In the sensing mode, the first transistor M1 remains off, the photodiode D1 is in the reverse biased state to convert the incident light into the current $I_{D1}$, the reverse bias current $I_{D1}$ charges the capacitor Cp to pump the voltage $V_A$ to (V2+Vd), the voltage Vd being a voltage generated by charging the capacitor Cp using the current $I_{D1}$. In the scan mode, the third transistor M3 may be turned on by the row selection signal Srow, the second transistor M2 may be configured into a source follower to convert the voltage $V_A$ into the current Id, so as to output a voltage Vout to serve as the output signal Scol. Then a processor receives the output signal Scol via the data driver 16 to process and analyze the same to obtain light intensity information. The voltage Vout may be expressed by Equation (1):

$$Vout = V2 + \frac{I_{D1} * t}{C} - V_{th} - \sqrt{\frac{2L * Id}{W\mu C_{ox}}} \qquad \text{Equation (1)}$$

wherein:
V2 is the second voltage;
$I_{D1}$ is the current generated by the photodiode D1;
t is the charging time of charging the capacitor Cp;
C is the capacitance of the capacitor Cp;
$V_{th}$ is the threshold voltage of the second transistor M2;
Id is the drain current of the second transistor M2;
L, W, μ, Cox are the channel length, the channel width, the mobility and the oxide capacitance of the second transistor M2, respectively.

As indicated in Equation (1), the output voltage Vout is positively correlated to the current $I_{D1}$ of the photodiode D1 and the charging time t of charging the capacitor Cp, and are negatively correlated to the capacitance C of the capacitor Cp. The smaller the capacitance C is, the larger the current $I_{D1}$ is, or the longer the charging time t is, the larger the output voltage Vout will be, resulting in easier low-light image recognition from under the screen. In some embodiments, the area of the photodiode D is increased to increase the reverse bias current $I_{D,r}$ and the output voltage Vout in order to recognize images in a low-light environment, and an equivalent capacitance of the parasitic capacitor Cd and the capacitor Cp is limited to a capacitance C, thereby eliminating the impact of the increased parasitic capacitor Cd without reducing the output voltage Vout. The capacitor Cp may have a fixed capacitance C between 1.2 fF and 10 fF, equivalent to 2% and 20% of the capacitance of the parasitic capacitor Cd.

The first transistor M1 and the third transistor M3 may be NMOS transistors or PMOS transistors. The reset driver 12 and the scan driver 14 may adjust the reset signal Srst and the row selection signal Srow in an appropriate manner to control the first transistor M1 and the third transistor M3 to perform the operations. In some embodiments, the first transistor M1 is an NMOS transistor and the third transistor M3 is a PMOS transistor. In other embodiments, the first transistor M1 is a PMOS transistor and the third transistor M3 is an NMOS transistor. In other embodiments, both the first transistor M1 and the third transistor M3 are PMOS transistors. Although only one image sensing circuit 10 is shown in FIG. 1, the electronic device 1 a may include a plurality of image sensing circuits 10 which maybe arranged in an array for sensing light at different positions.

Figure 2:
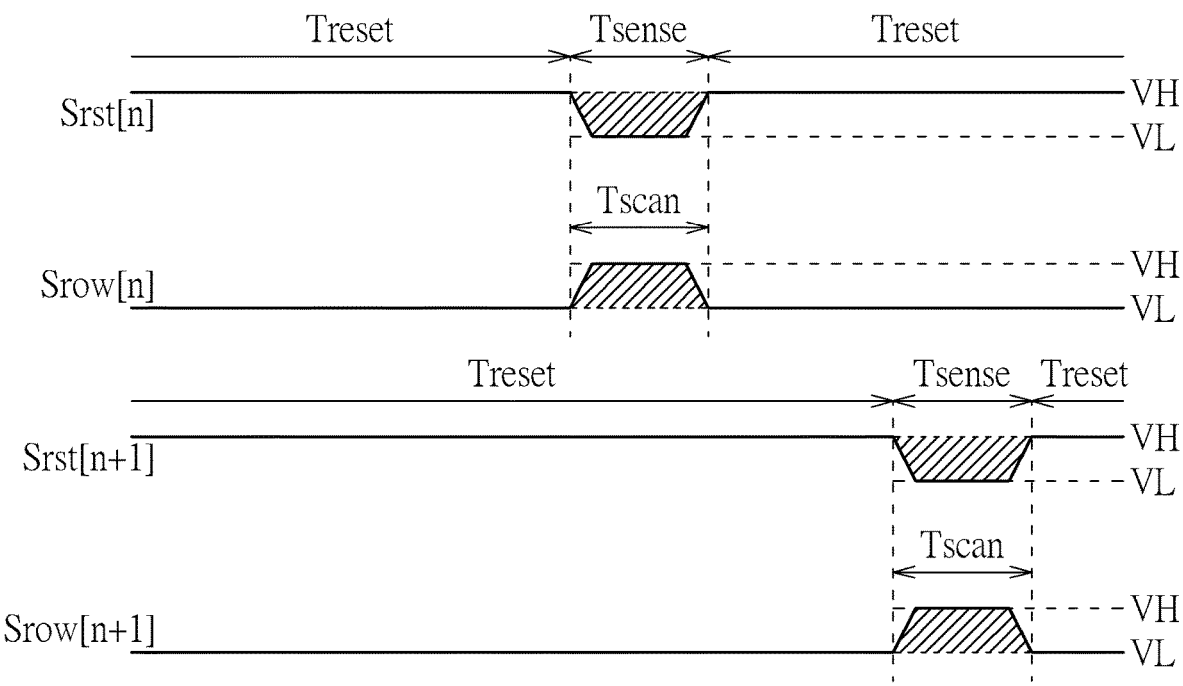
FIG. 2 is a timing diagram of a control method of the electronic device in FIG. 1.
Figure 3:
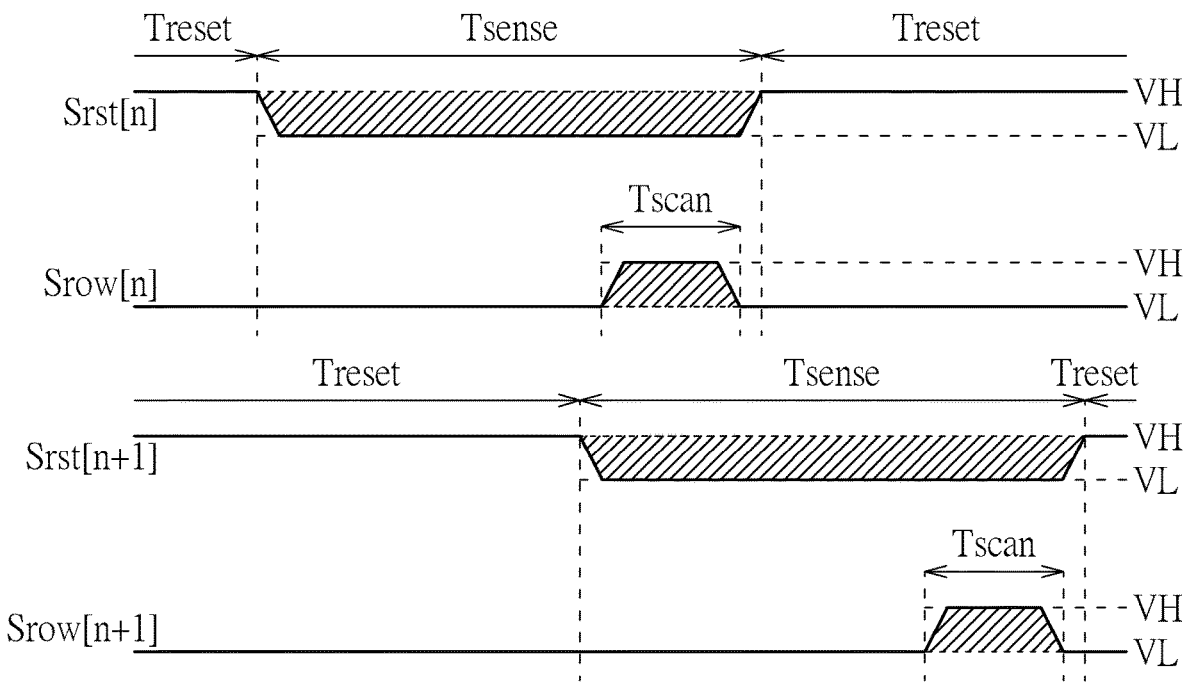
FIG. 3 is a timing diagram of another control method of the electronic device of FIG. 1.

FIGS. 2 and 3 show timing diagrams of selected signals of the electronic device 1 operating by two control methods. The selected signals include reset signals Srst[n], Srst[n+1] and the row selection signals Srow[n], Srow[n+1], respectively representing the reset signals and the row selection signals transmitted to the image sensing circuits 10 on the nth row and the (n+1)th row. The two control methods in FIGS. 2 and 3 may be used to detect light by way of sensing and scanning row by row. The reset signals Srst[n], Srst[n+1] may be used to set the image sensing circuits 10 on the nth row and the (n+1)th row to the reset mode during the reset period Treset, and set the image sensing circuits 10 on the nth row and the (n+1)th row to the sensing mode during the sensing period Tsense. The row selection signals Srow[n], Srow[n+1] may be used to set the image sensing circuits 10 on the nth row and the (n+1)th row to the scan mode during the scan period Tscan. FIG. 2 shows a control method employing synchronous reset signals Srst[n], Srst[n+1] and row selection signals Srow[n], Srow[n+1], performing the sensing mode and the scan mode simultaneously, and reducing a detection time. FIG. 3 shows a control method employing asynchronous reset signals Srst[n], Srst[n+1] and row selection signals Srow[n], Srow[n+1], performing the sensing mode for a period of time prior to performing the scan mode, and generating clearer signals. The operation methods of the reset mode, sensing mode and the scan mode have been provided in the description for FIG. 1, and will be omitted here for brevity.

In FIG. 2, the reset signal Srst[n] is set to a high potential VH to reset the voltage $V_A$ to the second voltage V2, then the reset signal Srst[n] is set to a low potential VL and the row selection signal Srow[n] is set to the high potential VH to simultaneously sense a change of the voltage $V_A$ and read an output signal Scol[n] on the nth row. That is, the reset signal Srst[n] and the row selection signal Srow[n] are complementary signals. During performing the sensing mode and the scan mode on the nth row, the reset signal Srst[n+1] is set to the high potential VH, and after completion of the sensing mode and the scan mode of the nth row, the reset signal Srst[n+1] is set to the low potential VL while the row selection signal Srow[n+1] is set to the high potential VH, so as to simultaneously sense the change of the voltage $V_A$ and read an output signal Scol[n+1] on the (n+1) row. That is, the reset signal Srst[n+1] and the row selection signal Srow[n+1] are complementary signals. By employing the control method in FIG. 2, the electronic device 1 may detect the light intensity and read corresponding output signals Scol[n], Scol[n+1] row by row.

The control method in FIG. 3 is similar to that in FIG. 2, but the sensing period Tsense of the nth row is extended and the scan period Tscan starts when the sensing period Tsense of the nth row is almost completed, and the (n+1) row operates in a similar manner. Compared to FIG. 2, in FIG. 3, the sensing period Tsense is longer, the capacitor Cp has a longer charging time, generating a higher voltage $V_A$, and resulting in a larger output signal Scol correspondingly.

Figure 4:
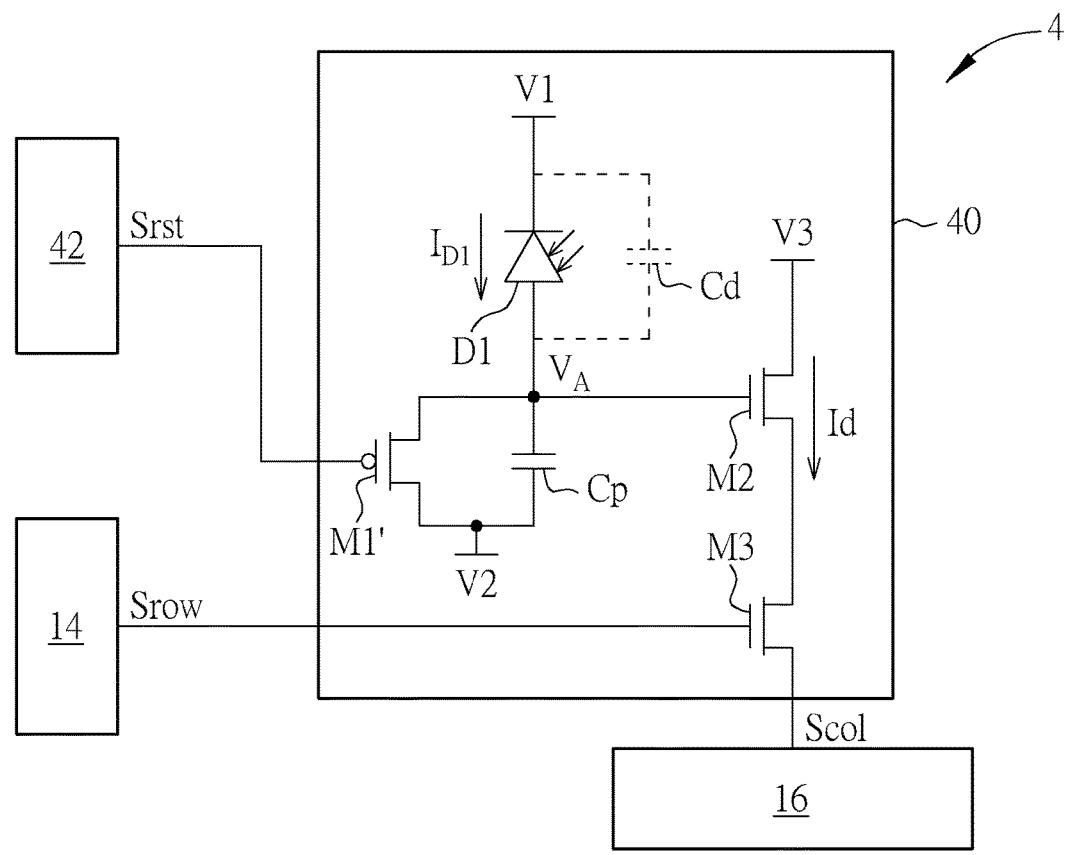
FIG. 4 is a schematic diagram of an electronic device according to another embodiment of the disclosure.

FIG. 4 is a schematic diagram of an electronic device 4 according to an embodiment of the disclosure. The electronic device 4 includes an image sensing circuit 40, a reset driver 42, the scan driver 14 and the data driver 16. The reset driver 42, the scan driver 14 and the data driver 16 are respectively coupled to the image sensing circuit 40 to control the image sensing circuit 40 to operate in the reset mode, the sensing mode or the scan mode. The electronic device 4 is configured and operated in a manner similar to the electronic device 1, except that the NMOS first transistor M1 in the image sensing circuit 10 is replaced with a PMOS first transistor M1' to enable the reset driver 42 to generate a corresponding reset Srst. Therefore, the explanation for the operations of the electronic device 4 will be omitted here.

Figure 5:
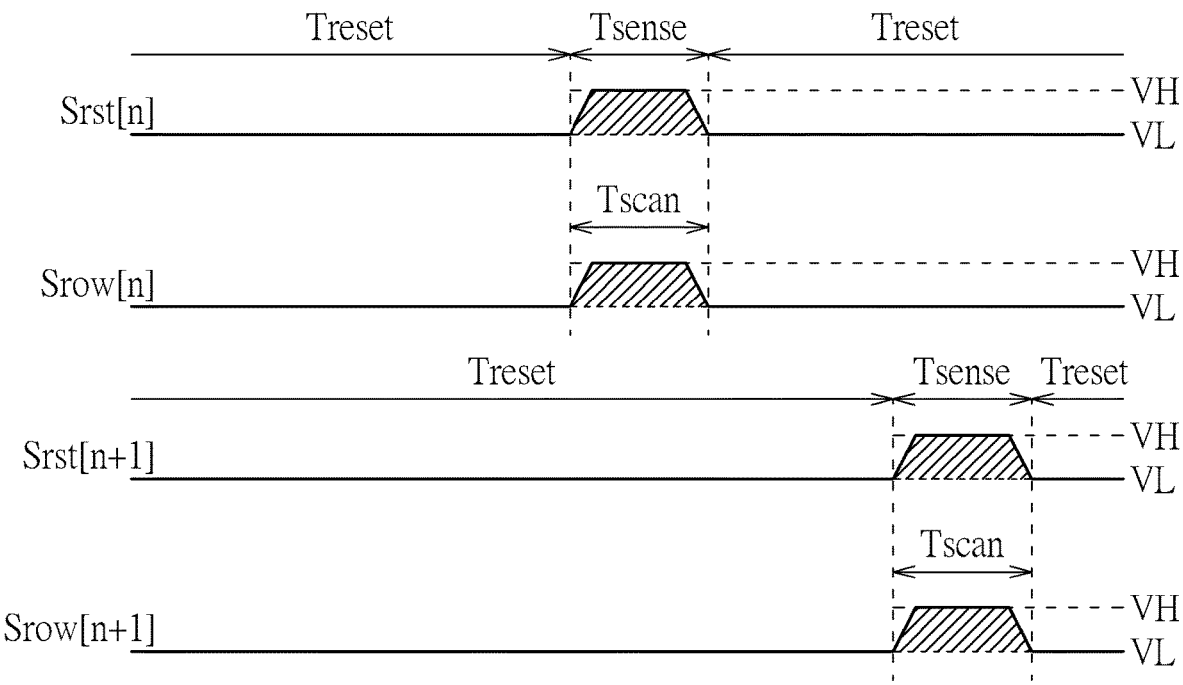
FIG. 5 is a timing diagram of a control method of the electronic device in FIG. 4.
Figure 6:
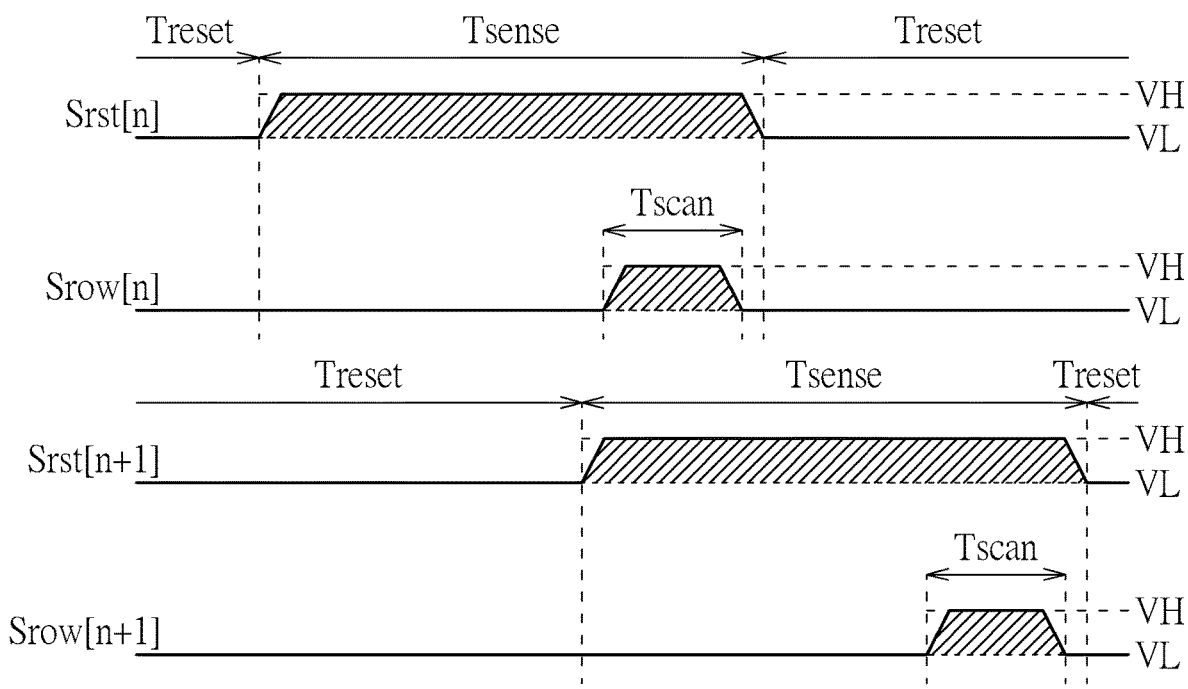
FIG. 6 is a timing diagram of another control method of the electronic device of FIG. 4.

FIGS. 5 and 6 show timing diagrams of selected signals of the electronic device 4 operated by two control methods. The selected signals include reset signals Srst[n], Srst[n+1] and the row selection signals Srow[n], Srow[n+1], respectively representing the reset signals and the row selection signals transmitted to the image sensing circuits 40 on the nth row and the (n+1)th row. Both the two control methods in FIGS. 5 and 6 may detect light by way of sensing and scanning row by row. FIG. 5 shows a control method employing synchronous reset signals Srst[n], Srst[n+1] and row selection signals Srow[n], Srow[n+1], performing the sensing mode and the scan mode simultaneously, and reducing a detection time. FIG. 6 shows a control method employing asynchronous reset signals Srst[n], Srst[n+1] and row selection signals Srow[n], Srow[n+1], performing the sensing mode for a period of time prior to performing the scan mode, and generating clearer signals. Since the first transistor M1' is a PMOS transistor, the reset signals Srst[n], Srst[n+1] and the row selection signals Srow[n], Srow[n+1] in FIG. 5 are identical signals and may be configured in the same manner, and as a result, one of the reset driver 42 and the scan driver 14 may be used to generate identical signals for the reset signals Srst[n], Srst[n+1] and the row selection signals Srow[n], Srow[n+1], reducing hardware costs . In other words, the reset signals Srst[n] and the row selection signals Srow[n] are identical signals, and the reset signals Srst[n+1] and the row selection signals Srow[n+1] are identical signals. Correspondingly, the control terminal of the first transistor M1' and the control terminal of the third transistor M3 may receive the identical signals generated by the one of the reset driver 42 and the scan driver 14. In comparison, in FIG. 6, since the reset signals Srst[n], Srst[n+1] and the row selection signals Srow[n], Srow[n+1] are asynchronous, the sense period Tsense occurs prior to the scan period Tscan and the length of the sense period Tsense exceeds that of the scan period Tscan, the reset driver 42 and the scan driver 14 may separately generate the reset signals Srst[n], Srst[n+1] and the row selection signals Srow[n], Srow[n+1]. FIGS. 5, 6 correspond to the control methods of controlling the electronic device 1 in FIGS. 2, 3, the details therefor will not be repeated here.

Figure 7:
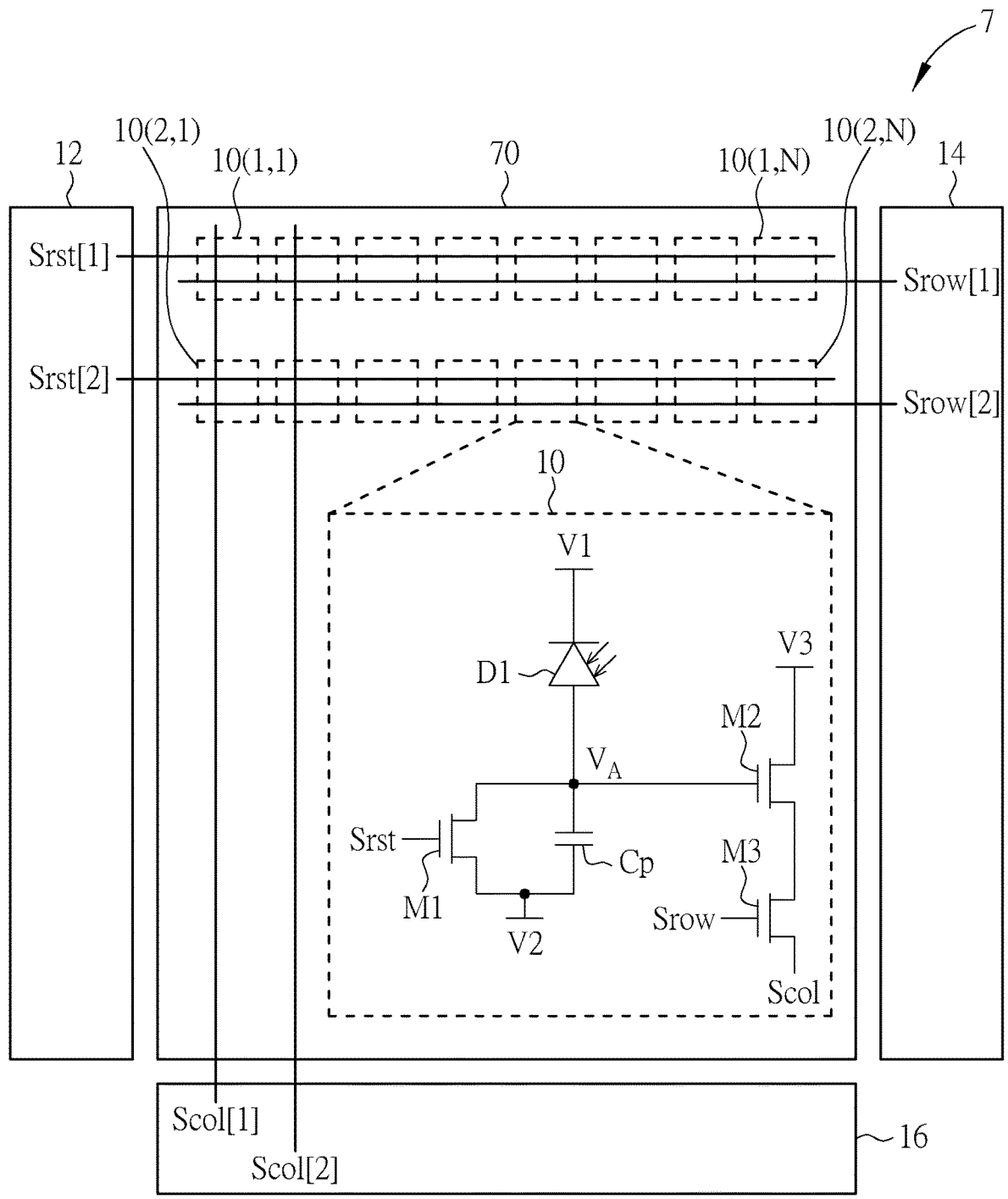
FIG. 7 is a schematic diagram of an electronic device according to an embodiment of the disclosure.

FIG. 7 is a schematic diagram of an electronic device 7 according to another embodiment of the disclosure. The electronic device 7 includes a pixel array 70, the reset driver 12, the scan driver 14 and the data driver 16. The reset driver 12, the scan driver 14 and the data driver 16 are respectively coupled to the pixel array 70 to control the pixel array 70 to operate in the reset mode, the sensing mode or the scan mode. The pixel array 70 includes a plurality of image sensing circuits 10(1,1) to 10(M,N) arranged in an array. The reset driver 12 and the scan driver 14 maybe respectively disposed on both sides of the pixel array 70, and the data driver 16 may be disposed on the bottom of the pixel array 70. The reset signal Srst[1] is used to reset the image sensing circuits 10 on the first row, and the reset signal Srst[2] is used to resets the image sensing circuits 10 on the second row. The row selection signal Srow[1] is used to select the image sensing circuits 10 on the first row, and the row selection signal Srow[2] is used to select the image sensing circuits 10 on the second row to read the detected light intensity.

The electronic devices in FIGS. 1, 4 and 7 may increase reverse bias current $I_{D1}$ by increasing the area of the photodiode D1, while coupling the capacitor Cp to the photodiode D in series to limit the equivalent capacitance of the photodiode D1 and the capacitor Cp to the capacitance C, thereby increasing the output voltage Vout, being easier to detect low-light image when used in a fingerprint scanner.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device comprising:
an image sensing circuit comprising:
a photodiode having a photodiode first terminal and a photodiode second terminal;
a first transistor having a first transistor control terminal, a first transistor first terminal, and a first transistor second terminal, the first transistor control terminal being configured to receive a reset signal, and the first transistor first terminal being coupled to the photodiode second terminal;
a second transistor having a second transistor control terminal, a second transistor first terminal, and a second transistor second terminal, and the second transistor control terminal being coupled to the photodiode second terminal;
a third transistor having a third transistor control terminal, a third transistor first terminal, and a third transistor second terminal, the third transistor control terminal being configured to receive a row selection signal, and the third transistor first terminal being coupled to the second transistor second terminal; and
a capacitor having a capacitor first terminal and a capacitor second terminal, the capacitor first terminal being coupled to the photodiode second terminal, and the capacitor second terminal being coupled to the first transistor second terminal.

2. The electronic device of claim 1, wherein a voltage difference between the photodiode first terminal and the photodiode second terminal ranges between 0.5V and 1.5V.

3. The electronic device of claim 1, wherein a voltage difference between the first transistor control terminal and the first transistor second terminal ranges between 0.5V and 2V.

4. The electronic device of claim 1, wherein capacitance of the capacitor ranges between 1.2 fF and 10 fF.

5. The electronic device of claim 1, wherein the first transistor and the third transistor are both NMOS transistors or both PMOS transistors.

6. The electronic device of claim 5, wherein the reset signal and the row selection signal are complementary signals.

7. The electronic device of claim 1, wherein the first transistor is an NMOS transistor and the third transistor is a PMOS transistor.

8. The electronic device of claim 1, wherein the first transistor is a PMOS transistor and the third transistor is an NMOS transistor.

9. The electronic device of claim 8, wherein the first transistor control terminal and the third transistor control terminal are configured to receive identical signals.

10. The electronic device of claim 1, wherein the third transistor has a dual-gate structure.

11. The electronic device of claim 1, wherein the reset signal and the row selection signal are in synchronization.

12. The electronic device of claim 1, wherein the reset signal and the row selection signal are asynchronous.

13. The electronic device of claim 1, wherein:
the photodiode first terminal is configured to receive a first voltage;
the first transistor second terminal is configured to receive a second voltage; and
the first voltage exceeds the second voltage.

14. The electronic device of claim 1, wherein the second transistor first terminal is configured to receive a variable voltage.

15. The electronic device of claim 1, wherein the second transistor is an NMOS transistor.

16. The electronic device of claim 1, wherein the photodiode has a parasitic capacitor, and capacitance of the capacitor ranges between 2% and 20% of capacitance of the parasitic capacitor.

17. The electronic device of claim 1, wherein the first transistor has a dual-gate structure.

\* \* \* \* \*